(12) United States Patent
Yeh et al.

(10) Patent No.: US 9,997,615 B2
(45) Date of Patent: Jun. 12, 2018

(54) METHOD FOR FORMING SEMICONDUCTOR STRUCTURE WITH EPITAXIAL GROWTH STRUCTURE

(71) Applicant: Taiwan Semiconductor Manufacturing Co., Ltd., Hsinchu (TW)

(72) Inventors: Che-Yu Yeh, New Taipei (TW); Chung-Cheng Wu, Jhubei (TW); Cheng-Long Chen, Hsinchu (TW); Gwan-Sin Chang, Hsinchu (TW); Pang-Yen Tsai, Jhubei (TW); Yen-Ming Chen, Jhubei (TW); Yasutoshi Okuno, Hsinchu (TW); Ying-Hsuan Wang, Changhua County (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days. days.

(21) Appl. No.: 14/954,208

(22) Filed: Nov. 30, 2015

(65) Prior Publication Data

US 2017/0154978 A1    Jun. 1, 2017

(51) Int. Cl.
*H01L 29/66* (2006.01)
*H01L 21/02* (2006.01)
(Continued)

(52) U.S. Cl.
CPC .. *H01L 29/66795* (2013.01); *H01L 21/02532* (2013.01); *H01L 21/02639* (2013.01); *H01L 21/3065* (2013.01); *H01L 21/3081* (2013.01); *H01L 29/1054* (2013.01); *H01L 29/165* (2013.01); *H01L 29/66545* (2013.01); *H01L 29/7848* (2013.01)

(58) Field of Classification Search
CPC ......... H01L 21/02532; H01L 21/02381; H01L 21/0245; H01L 29/785; H01L 21/3083
See application file for complete search history.

(56) References Cited

U.S. PATENT DOCUMENTS 8,242,023 B2 *  8/2012  Yamaguchi ......... H01L 29/0634
                                                           438/478
8,669,147 B2 *  3/2014  Pham ................ H01L 29/66795
                                                           257/270
(Continued)

OTHER PUBLICATIONS

Kirsten et al. ("Deposition of thick doped polysilicon films with low stress in an epitaxial reactor for surface micromachining applications." Thin Solid Films 259 (1195) 181-187).*

*Primary Examiner* — Stephen Bradley
(74) *Attorney, Agent, or Firm* — Birch, Stewart, Kolasch & Birch, LLP

(57) ABSTRACT

Methods for forming semiconductor structures are provided. The method for manufacturing a semiconductor structure includes forming a hard mask structure over a substrate and etching the substrate through an opening of the hard mask structure to form a trench. The method for manufacturing a semiconductor structure further includes removing a portion of the hard mask structure to enlarge the opening and forming an epitaxial-growth structure in the trench and the opening.

20 Claims, 17 Drawing Sheets

(51) Int. Cl.
*H01L 21/3065* (2006.01)
*H01L 29/165* (2006.01)
*H01L 21/308* (2006.01)
*H01L 29/10* (2006.01)
*H01L 29/78* (2006.01)

(56) References Cited

U.S. PATENT DOCUMENTS

| | | | |
|---|---|---|---|
| 8,742,509 B2* | 6/2014 | Lee | H01L 29/66795 |
| | | | 257/368 |
| 2010/0258809 A1* | 10/2010 | Muller | H01L 21/02532 |
| | | | 257/66 |
| 2014/0308788 A1* | 10/2014 | Lin | H01L 29/66719 |
| | | | 438/268 |
| 2014/0377917 A1* | 12/2014 | He | H01L 27/0886 |
| | | | 438/157 |
| 2015/0091065 A1* | 4/2015 | Wei | H01L 27/14806 |
| | | | 257/227 |
| 2015/0179768 A1 | 6/2015 | Chen et al. | |
| 2015/0206939 A1 | 7/2015 | Huang et al. | |
| 2015/0270342 A1 | 9/2015 | Tsai et al. | |
| 2015/0372084 A1* | 12/2015 | Qi | H01L 29/0692 |
| | | | 257/506 |

* cited by examiner ical cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

METHOD FOR FORMING SEMICONDUCTOR STRUCTURE WITH EPITAXIAL GROWTH STRUCTURE

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

One of the important drivers for increased performance in a semiconductor structure is the higher levels of integration of circuits. This is accomplished by miniaturizing or shrinking device sizes on a given chip. As device sizes shrink, tolerances play a more and more important role in the manufacturing process.

However, although existing semiconductor manufacturing processes have generally been adequate for their intended purposes, as device scaling-down continues, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 1A-2 to 1E-2 are cross-sectional representations of various stages of forming the semiconductor structure shown along line A-A' illustrated in FIGS. 1A-1 to 1E-1 in accordance with some embodiments.

FIG. 1I-2 is a cross-sectional representation of the semiconductor structure shown along line B-B' as illustrated in FIG. 1I-1 in accordance with some embodiments.

FIGS. 2A-1 to 2C-1 are perspective views of various stages of forming a semiconductor structure in accordance with some embodiments.

FIGS. 2A-2 to 2C-2 are cross-sectional representations of various stages of forming the semiconductor structure shown along line C-C' as illustrated in FIGS. 2A-1 to 2C-1 in accordance with some embodiments.

DETAILED DESCRIPTION

Figures 1, 1A:
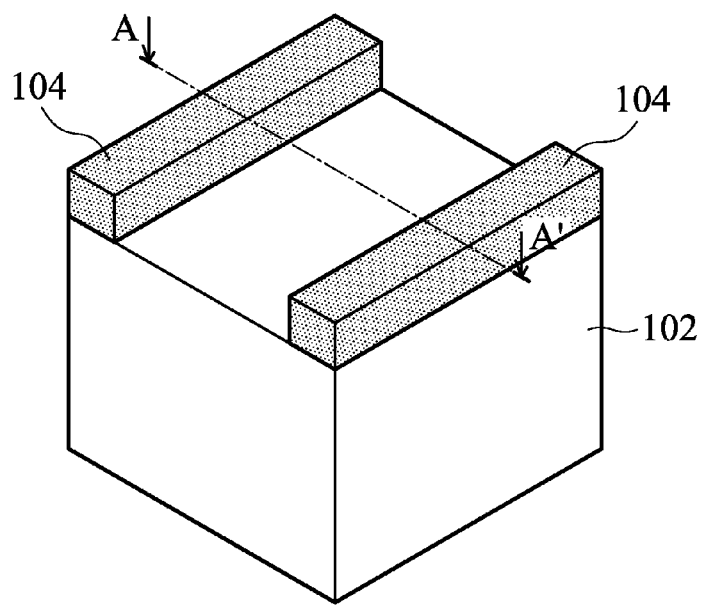
FIGS. 1A-1 to 1I-1 are perspective views of various stages of forming a semiconductor structure in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of semiconductor structures and methods for forming the same are provided. The semiconductor structure may include a substrate, and an epitaxial-growth structure formed in a trench of the structure. The trench may be formed by patterning the substrate through an opening of a hard mask structure. After the trench is formed in the substrate, the opening may be enlarged, so that the epitaxial-growth structure formed in the trench may have fewer dislocations in its structure.

Figures 1, 1A, 2:
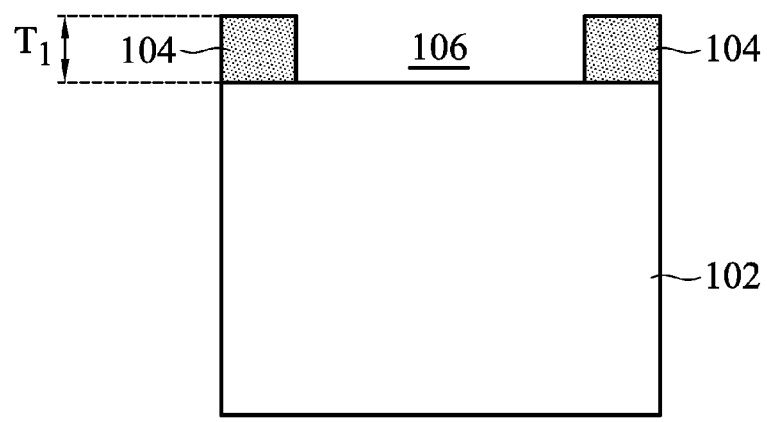
Figures 1, 1B:
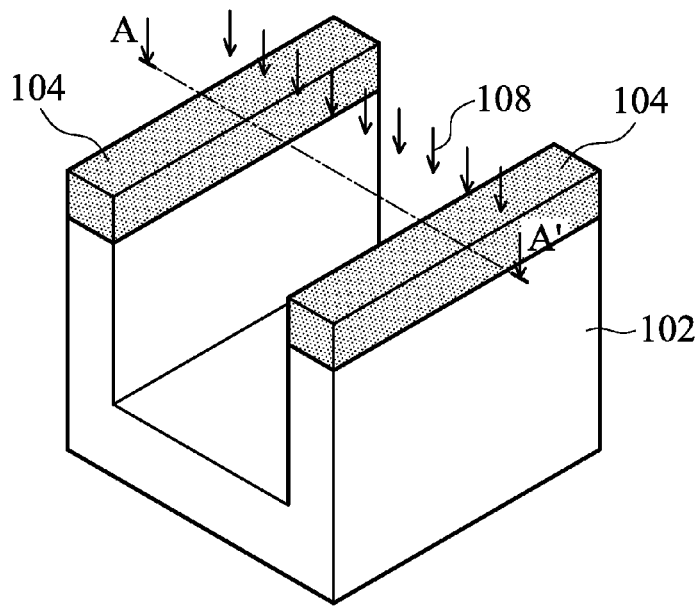
Figures 1, 1B, 2:
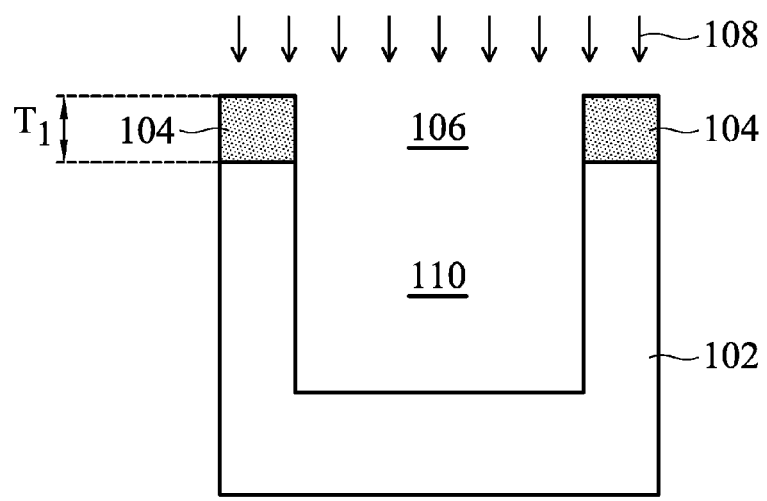
Figures 1, 1C:
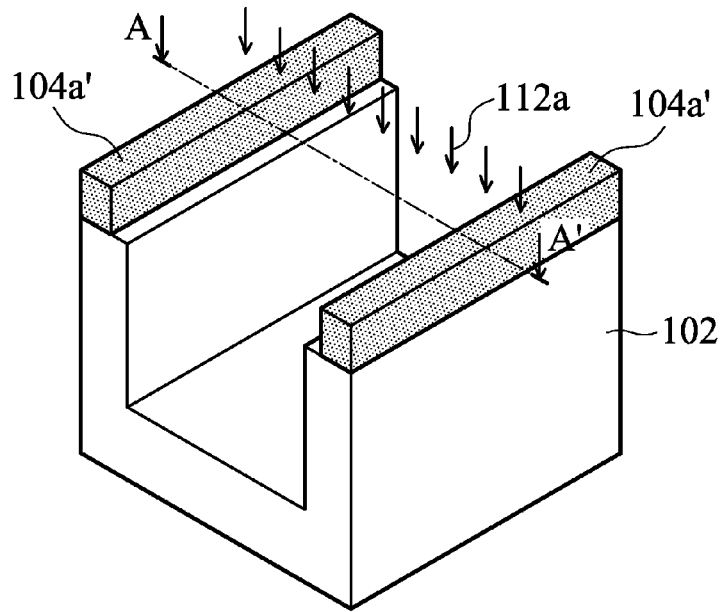
Figures 1, 1C, 2:
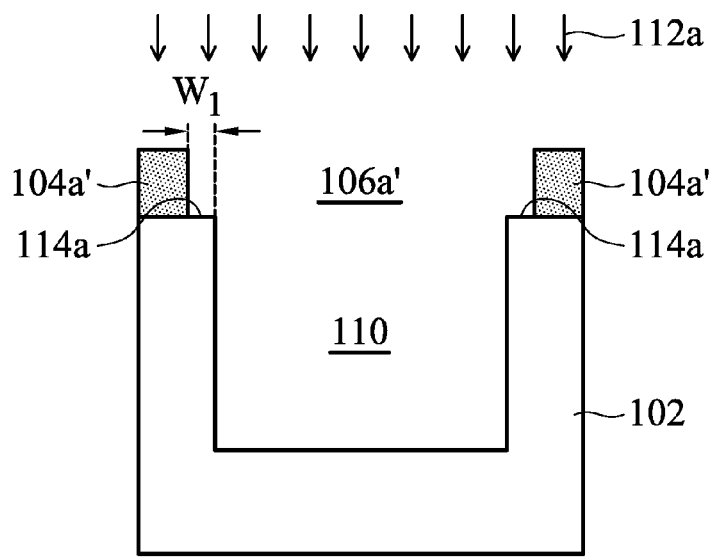
Figures 1, 1D:
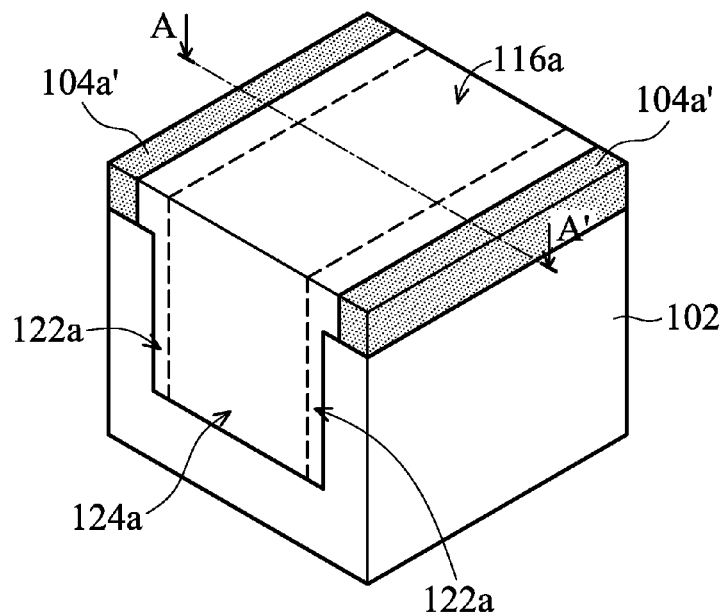
Figures 1, 1D, 2:
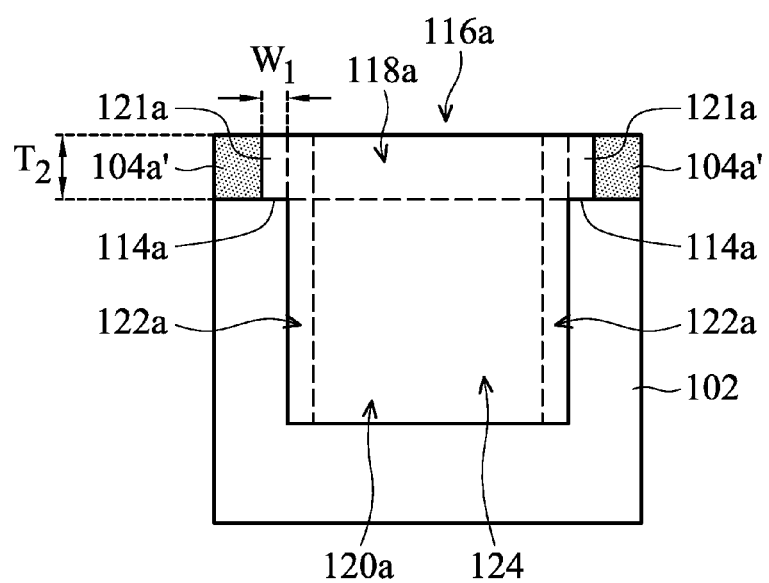
Figures 1, 1E:
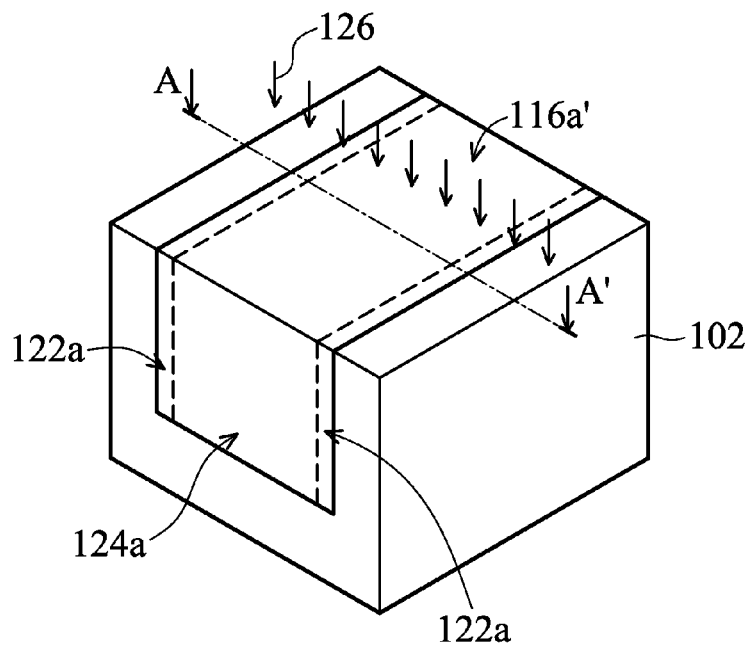
Figures 1, 1E, 2:
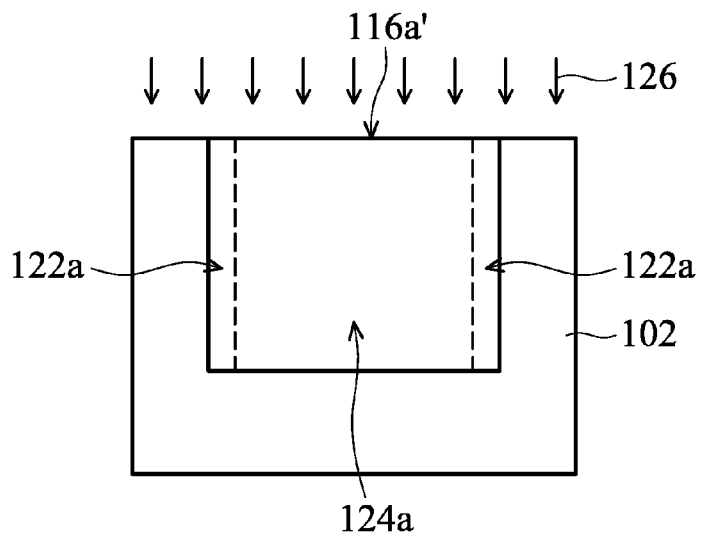
Figure 1F:
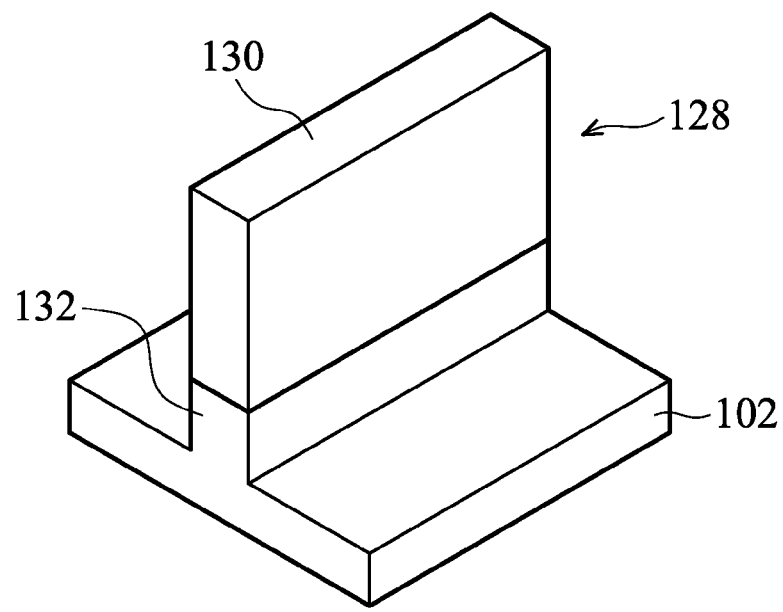
Figure 1G:
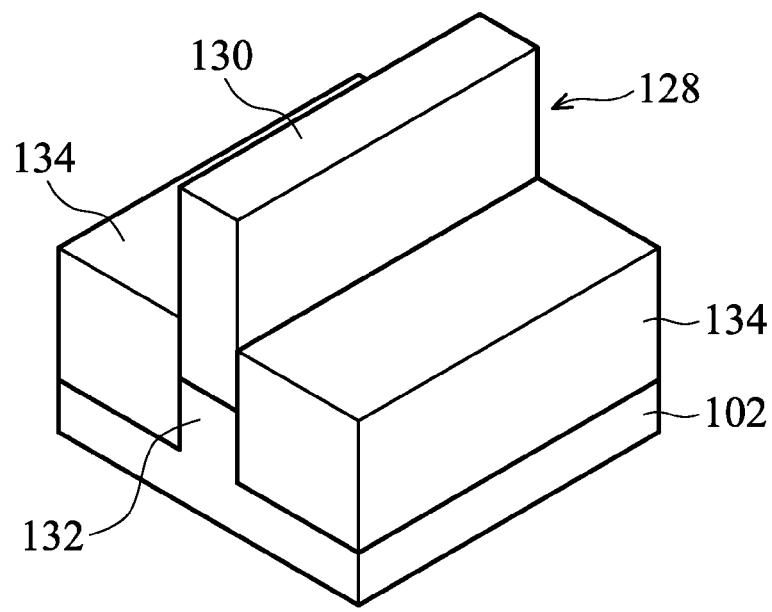
Figure 1H:
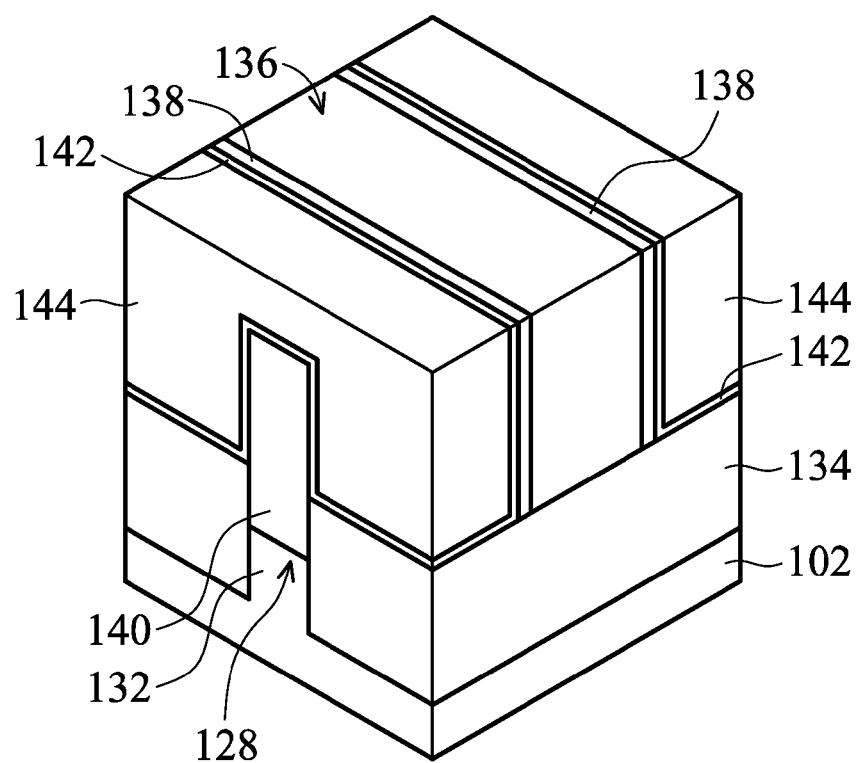
Figures 1, 1I:
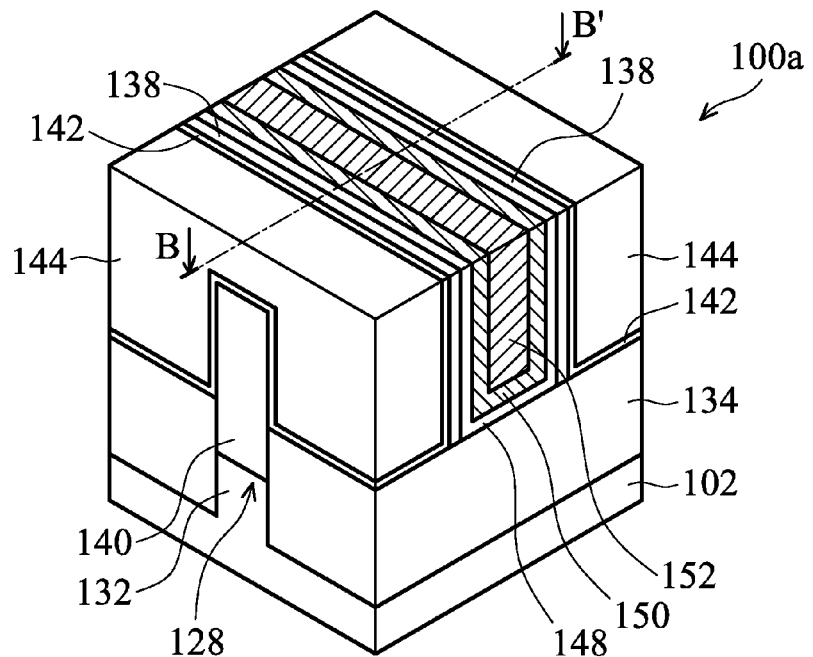
Figures 1, 1I, 2:
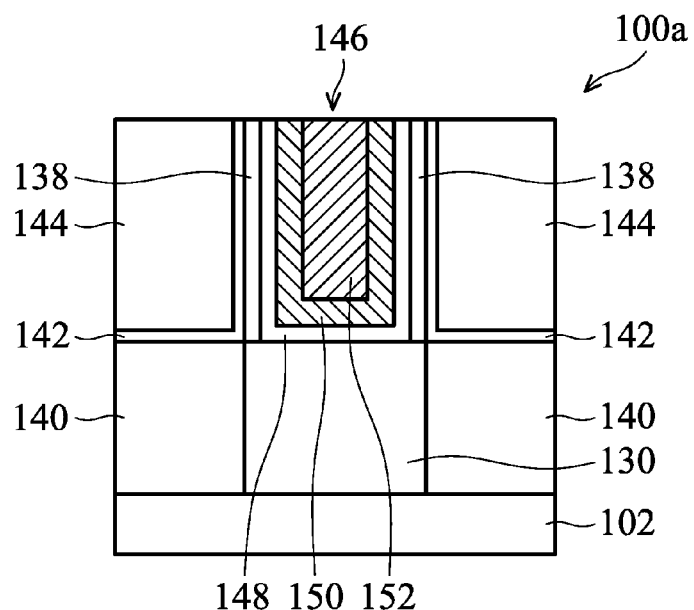

FIGS. 1A-1 to 1I-1 are perspective views of various stages of forming a semiconductor structure 100a in accordance with some embodiments. FIGS. 1A-2 to 1E-2 are cross-sectional representations of various stages of forming the semiconductor structure 100a shown along line A-A' illustrated in FIGS. 1A-1 to 1E-1 in accordance with some embodiments. FIG. 1I-2 is a cross-sectional representation of the semiconductor structure 100a shown along line B-B' as illustrated in FIG. 1I-1 in accordance with some embodiments.

As shown in FIGS. 1A-1 and 1A-2, a hard mask structure 104 is formed over a substrate 102 in accordance with some embodiments. In some embodiments, the substrate 102 is made of a first semiconductor material. In some embodiments, the substrate 102 is a silicon substrate. In some embodiments, the first semiconductor material includes elementary semiconductor materials, compound semiconductor materials, and/or alloy semiconductor materials. In some embodiments, the first semiconductor material includes Si (e.g. crystal silicon, polycrystalline silicon, or amorphous silicon), Ge, SiGe, SiC, SiCGe, SiP, SiB, SiGeB, SiCP, GaAs, GaP, InP, InAs, InGaAs, AlInGaAs, GaAsP, AlInAs, AlGaAs, GaInP, and/or GaInAsP.

The hard mask structure 104 is formed over the substrate 102 and has an opening 106 to expose a portion of the substrate 102, as shown in FIGS. 1A-1 and 1A-2 in accordance with some embodiments. In some embodiments, the hard mask structure 104 is made of oxide, nitride, oxynitride, or the like. In some embodiments, the hard mask structure 104 is made of silicon oxide, silicon nitride, silicon oxynitride, or the like. In some embodiments, the hard mask structure 104 is formed by performing a chemical vapor deposition (CVD) process, a physical vapor deposition, (PVD) process, an atomic layer deposition (ALD) process, a spin-on coating process, or other applicable processes. In some embodiments, the hard mask structure 104 has a thickness $T_1$ greater than about 1 nm. The thickness of the hard mask structure 104 may decide the distance it should be pulled back in a subsequent etching process (details will be described later).

After the hard mask structure 104 is formed, a first etching process 108 is performed, as shown in FIGS. 1B-1 and 1B-2 in accordance with some embodiments. During the first etching process 108, the substrate 102 is etched through the opening 106 of the hard mask structure 104 to form a trench 110, as shown in FIG. 1B-2 in accordance with some embodiments. Since the trench 110 is formed by etching through the opening 106, the trench 110 and the opening 106 have substantially the same widths. In some embodiments, the first etching process 108 is a dry etching process.

After the trench 110 is formed in the substrate 102, a portion of the hard mask structure 104 is removed, as shown in FIGS. 1C-1 and 1C-2 in accordance with some embodiments. In some embodiments, the portion of the hard mask structure 104 is removed by performing a second etching process 112a. During the second etching process 112a, the hard mask structure 104 is etched from the sidewall of the opening 106, so that the opening 106 in the hard mask structure 104 is enlarged.

After the second etching process 112a, the original sidewall of the hard mask structure 104 (as shown in FIG. 1B-2) is pulled back to form a shrunken hard mask structure 104a', and the opening 106 (as shown in the FIG. 1B-2) is enlarged to form an enlarged opening 106a', as shown in FIG. 1C-2 in accordance with some embodiments. Accordingly, the width of the enlarged opening 106a' of the shrunken hard mask structure 104a' is greater than the width of the trench 110 in the substrate 102.

In addition, the top surface of a portion 114a of the substrate 102 is exposed by the enlarged opening 106a'. As shown in FIG. 1B-2, the portion 114a of the substrate 102 is covered by the hard mask structure 104 before the second etching process 112a is performed. However, after the second etching process 112a, the portion 114a of the substrate 102 is not covered by the shrunken hard mask structure 104a' but is exposed by the enlarged opening 106a'.

In some embodiments, the width $W_1$ of the portion 114a of substrate 102 is greater than about 1 nm. The width $W_1$ of the portion 114a of substrate 102 may be defined as the distance between the sidewall of the shrunken hard mask structure 104a' and the sidewall of the trench 110 measured along the top surface of the substrate 102. If the width $W_1$ of the portion 114a of substrate 102 is too large, there may be too much of the hard mask structure 104 being removed, such that the cost for forming an epitaxial-growth structure afterwards may increase. On the other hand, if the width $W_1$ of the portion 114a of substrate 102 is too small, active area may become smaller due to dislocation penetration (details will be described later).

After the enlarged opening 106a' is formed, an epitaxial-growth structure 116a is formed in the trench 110 and the enlarged opening 106a', as shown in FIGS. 1D-1 and 1D-2 in accordance with some embodiments. In some embodiments, the epitaxial-growth structure 116a is formed by growing a second semiconductor material in the trench 110 and in the enlarged opening 106a'. In some embodiments, the second semiconductor material is grown by performing an epitaxial deposition process. In some embodiments, the second semiconductor material which is used to form the epitaxial-growth structure 116a is different from the first semiconductor material which is used to form the substrate 102. In some embodiments, the second semiconductor material includes Si (e.g. crystal silicon, polycrystalline silicon, or amorphous silicon), Ge, SiGe, SiC, SiCGe, SiP, SiB, SiGeB, SiCP, GaAs, GaP, InP, InAs, InGaAs, AlInGaAs, GaAsP, AlInAs, AlGaAs, GaInP, and/or GaInAsP.

The epitaxial-growth structure 116a includes a top portion 118a formed in the enlarged opening 106a' and a bottom portion 120a formed in the trench 110, as shown in FIG. 1D-2 in accordance with some embodiments. Since the width of the enlarged opening 106a' is greater than the width of the trench 110, the width of the top portion 118a of the epitaxial-growth structure 116a is greater than the width of the bottom portion 120a of the epitaxial-growth structure 116a. As shown in FIG. 1D-2, the top portion 118a of the epitaxial-growth structure 116a has an extending portion 121a formed over the portion 114a of the substrate 102.

In addition, the extending portion 121a of the top portion 118a of the epitaxial-growth structure 116a is in direct contact with the sidewall of the shrunken hard mask structure 104a'. During the formation of epitaxial-growth structure 116a, dislocations may be formed along the interface between the shrunken hard mask structure 104a' and the epitaxial-growth structure 116a and tend to penetrate inwardly and downwardly in the epitaxial-growth structure 116a. However, since the epitaxial-growth structure 116a has an extending portion 121a formed over the portion 114a of the substrate 102, the interface between the shrunken hard mask structure 104a' and the epitaxial-growth structure 116a is located away from the trench 110. Therefore, the formation of the dislocations may be blocked by the portion 114a of the substrate 102, so that the dislocations penetration in the epitaxial-growth structure 116a can be confined in a relatively small region. Accordingly, the amount of dislocations penetration in the epitaxial-growth structure 116a may be reduced.

As described above, the formation of dislocations may be blocked by the portion 114a of the substrate 102 so that the dislocations may be confined in a relatively small region. Therefore, the width $W_1$ of the portion 114a of the substrate 102 may be controlled so that the formation of dislocation in the epitaxial-growth structure 116a can be confined. In addition, the extending portion 121a also has a width $W_1$ in accordance with some embodiments.

In addition, the thickness $T_2$ of the extending portion 121a (or the thickness of the top portion 118a) of the epitaxial-growth structure 116a may also be adjusted to confine the formation of dislocation. In some embodiments, a ratio of the thickness $T_2$ of the extending portion 121a to the width $W_1$ of the extending portion 121a is in a range from about 0.01 to about 3. By adjusting the ratio of the thickness $T_2$ to the width $W_1$ of the extending portion 121a, the formation of dislocations may also be controlled, so that the dislocations may be confined in a relatively small area.

In some embodiments, the epitaxial-growth structure 116a includes a dislocation region 122a and an active region 124a, as shown in FIGS. 1D-1 and 1D-2. The dislocation region 122a is referred to the region near the periphery of the epitaxial-growth structure 116a and may include dislocations formed therein. The active region 124a is referred to the central region of the epitaxial-growth structure 116a that is substantially dislocation-free. In subsequent manufacturing processes, active elements may be formed in the active region 124a.

After the epitaxial-growth structure 116a is formed, a polishing process 126 is performed on the shrunken hard mask structure 104a' and the top portion 118a of the epitaxial-growth structure 116a, as shown in FIGS. 1E-1 and 1E-2 in accordance with some embodiments. In some embodiments, the polishing process 126 is a mechanical chemical polishing process. As shown in FIG. 1E-2, the polishing process 126 may be performed until the top surface of the substrate 102 is exposed.

After the polishing process 126 is performed, the shrunken hard mask structure 104a' and the top portion 118a of the epitaxial-growth structure 116a are removed. As shown in FIG. 1E-2, the epitaxial-growth structure 116a' (e.g. the bottom portion 120a shown in FIG. 1D-2) is formed in the trench 110. In addition, the epitaxial-growth structure 116a' includes the dislocation region 122a and the active region 124a in accordance with some embodiments. Since the top portion 118a, including the extending portion 121a, is removed by the polishing process 126, the remaining epitaxial-growth structure 116a' has a relatively small dislocation region 122a. Therefore, the active region 124a, which can be used to form active elements therein, can be relatively large, and numbers of elements may be formed in the epitaxial-growth structure 116a' in subsequent manufacturing processes.

After the polishing process 126 is performed, a fin structure 128 is formed, as shown in FIG. 1F in accordance with some embodiments. In some embodiments, the fin structure 128 is formed by patterning the epitaxial-growth structure 116a' and the substrate 102. As shown in FIG. 1F, the fin structure 128 includes a second semiconductor material portion 130 and a first semiconductor material portion 132. In some embodiments, the first semiconductor material portion 132 is made of Si, and the second semiconductor material portion 130 is made of SiGe.

Afterwards, an isolation structure 134 is formed over the substrate 102, and the fin structure 128 is surrounded by the isolation structure 134, as shown in FIG. 1G in accordance with some embodiments. The isolation structure 134 may be formed by depositing an insulating layer over the substrate 102 and recessing the insulating layer. In some embodiments, the isolation structure 134 is made of silicon oxide, silicon nitride, silicon oxynitride, fluoride-doped silicate glass (FSG), or other low-K dielectric materials.

Next, a dummy gate structure 136 is formed across the fin structure 128 and extends over isolation structure 134, as shown in FIG. 1H in accordance with some embodiments. In some embodiments, the dummy gate structure 136 includes a dummy gate dielectric layer and a dummy gate electrode layer formed over the dummy gate dielectric layer. In some embodiments, the dummy gate dielectric layer is made of silicon oxide, silicon nitride, silicon oxynitride, hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), zirconium oxide, titanium oxide, aluminum oxide, hafnium dioxide-alumina ($HfO_2$—$Al_2O_3$) alloy, or other applicable dielectric materials. In some embodiments, the dummy gate electrode layer is made of polysilicon.

After the dummy gate structure 136 is formed, spacers 138 are formed on the sidewalls of the dummy gate structure 136 in accordance with some embodiments. In some embodiments, the spacers 138 are made of silicon nitride, silicon oxide, silicon oxynitride, silicon carbide, or other applicable dielectric materials. The spacers 138 may include a single layer or multiple layers.

Next, source/drain structures 140 are formed in the fin structure 128, as shown in FIG. 1H in accordance with some embodiments. In some embodiments, the second semiconductor material portion 130 of the fin structure 128 adjacent to the dummy gate structure 136 are recessed to form recesses at two sides of the fin structure 128, and strained materials are grown in the recesses by an epitaxial (epi) process to form the source/drain structures 140. In some embodiments, the source/drain structures 140 include Ge, SiGe, InAs, InGaAs, InSb, GaAs, GaSb, InAlP, InP, or the like. In addition, an implantation process may be performed to form the source/drain structures 140.

After the source/drain structures 140 are formed, a contact etch stop layer (CESL) 142 is formed conformally over the substrate 102, and an inter-layer dielectric (ILD) layer 144 is formed over the contact etch stop layer 142, as shown in FIG. 1H in accordance with some embodiments. In some embodiments, the contact etch stop layer 142 is made of silicon nitride, silicon oxynitride, and/or other applicable materials. The contact etch stop layer 142 may be formed by plasma enhanced CVD, low pressure CVD, ALD, or other applicable processes.

The inter-layer dielectric layer 144 may include multilayers made of multiple dielectric materials, such as silicon oxide, silicon nitride, silicon oxynitride, phosphosilicate glass (PSG), borophosphosilicate glass (BPSG), and/or other applicable low-k dielectric materials. The inter-layer dielectric layer 144 may be formed by chemical vapor deposition (CVD), physical vapor deposition, (PVD), atomic layer deposition (ALD), spin-on coating, or other applicable processes.

Next, a polishing process is performed on the inter-layer dielectric layer 144 and the contact etch stop layer 142 to expose the top surface of the dummy gate structure 136 in accordance with some embodiments. In some embodiments, a chemical mechanical polishing (CMP) process is performed until the top surface of the dummy gate structure 136 is exposed.

After the polishing process is performed, the dummy gate structure 136 is replaced by a metal gate structure 146, as shown in FIGS. 1I-1 and 1I-2 in accordance with some embodiments. In some embodiments, the dummy gate structure 136 is removed to form a trench between the spacers 138 by performing a dry etching process. After the dummy gate structure 136 is removed, the metal gate structure 146 is formed in the trench. In some embodiments, the metal gate structure 146 includes a gate dielectric layer 148, a work function metal layer 150, and a gate electrode layer 152. More specifically, the gate dielectric layer 148 is formed on the sidewalls of the spacers 138, on the top surface of the isolation structure 134, and on the top surface of the second semiconductor material portion 130 of the fin structure 128, as shown in FIGS. 1I-1 and 1I-2 in accordance with some embodiments. In addition, the work function metal layer 150 and the gate electrode layer 152 are conformally formed over the gate dielectric layer 148 afterwards.

In some embodiments, the gate dielectric layer 148 is made of high-k dielectric materials, such as metal oxides, metal nitrides, metal silicates, transition metal-oxides, transition metal-nitrides, transition metal-silicates, or oxynitrides of metals. Examples of the high-k dielectric material include, but are not limited to, hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), zirconium oxide, titanium oxide, aluminum oxide, hafnium dioxide-alumina ($HfO_2$—$Al_2O_3$) alloy, or other applicable dielectric materials.

The work function metal layer 150 is formed over the gate dielectric layer 148 and is customized to have the proper work function. For example, if a P-type work function metal (P-metal) for a PMOS device is desired, TiN, WN, or W may be used. On the other hand, if an N-type work function metal (N-metal) for NMOS devices is desired, TiAl, TiAlN, or TaCN, may be used.

The gate electrode layer 152 is formed over the work function metal layer 150 in accordance with some embodiments. In some embodiments, the gate electrode layer 152 is made of a conductive material, such as aluminum, copper, tungsten, titanium, tantulum, or other applicable materials. The gate dielectric layer 148, the work function metal layer 150, and the gate electrode layer 152 may be formed by any applicable process to any applicable thickness.

It should be noted that additional layers may be formed above and/or below the gate dielectric layer 148, the work function metal layer 150, and the gate electrode layer 152, such as liner layers, interface layers, seed layers, adhesion layers, barrier layers, or the like. In addition, the gate dielectric layer 148, the work function metal layer 150, and the gate electrode layer 152 may include more than one layer made of various materials.

As shown in FIG. 1I-1, the metal gate structure 146 is formed across the fin structure 128, and the second semiconductor material portion 130 of the fin structure 128 can be used as a channel region in the semiconductor structure 100a. As described previously, the second semiconductor material portion 130 of the fin structure 128 is formed by patterning the epitaxial-growth structure 116a', which is formed by performing the processes described in FIGS. 1A-1 to 1E-2 and has relatively fewer dislocations. Therefore, the performance of the semiconductor structure 100a may be improved.

It should be noted that, although the epitaxial-growth structure 116a is used to form the fin structure 128 in the embodiments described above, the epitaxial-growth structures formed by the processes shown in FIGS. 1A-1 to 1D-2 may be applied to various applications. For example, other active elements may be formed in/on/from the epitaxial-growth structures, and the concept of the disclosure is not intended to be limiting.

Figures 1, 2A:
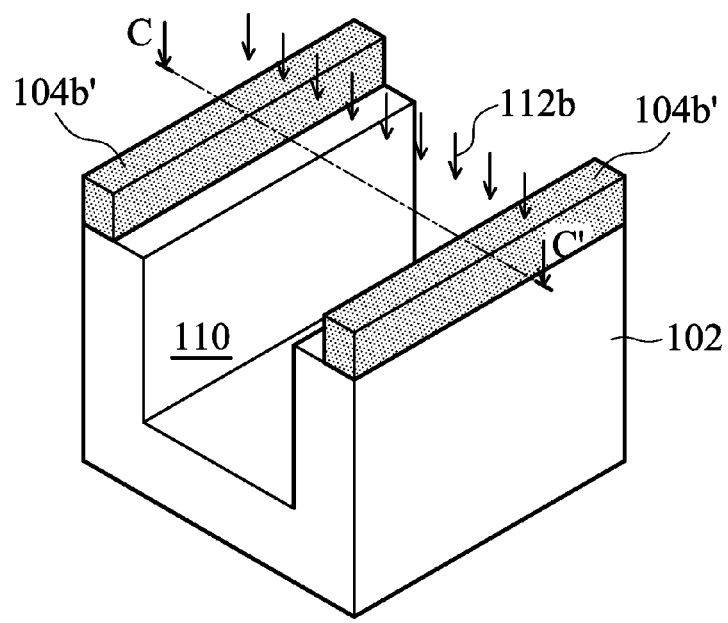
Figures 2, 2A:
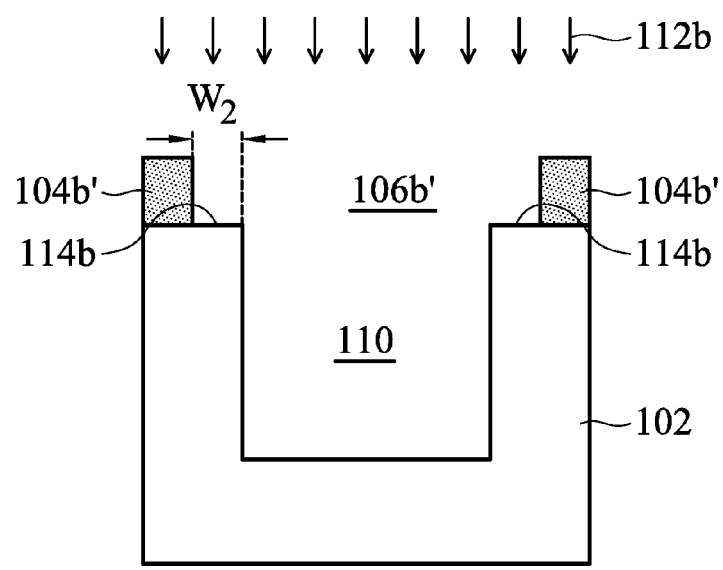
Figures 1, 2B:
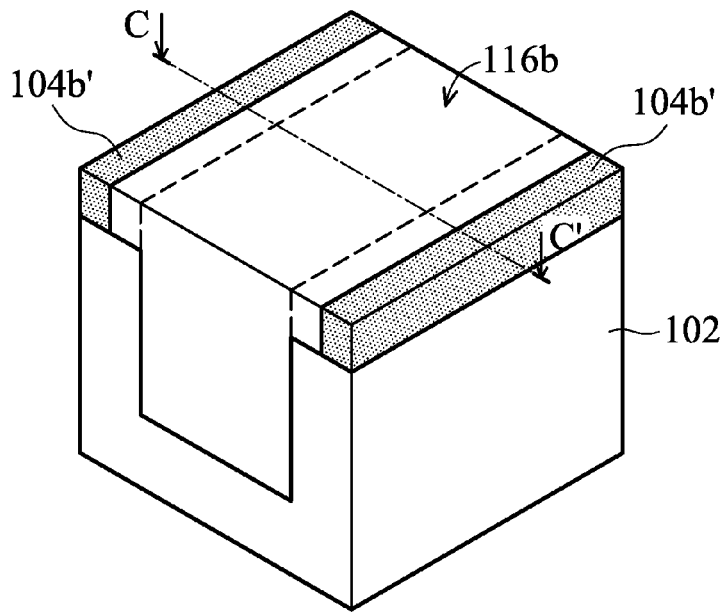
Figures 2, 2B:
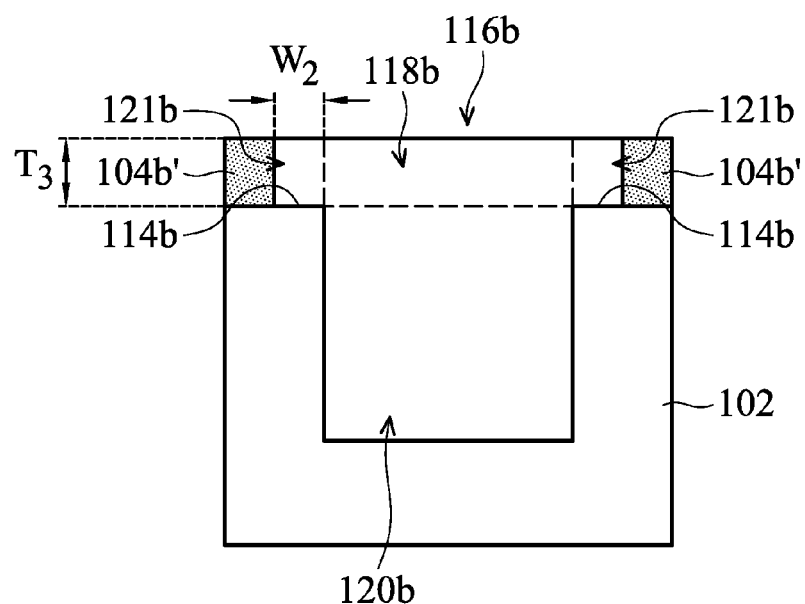
Figures 1, 2C:
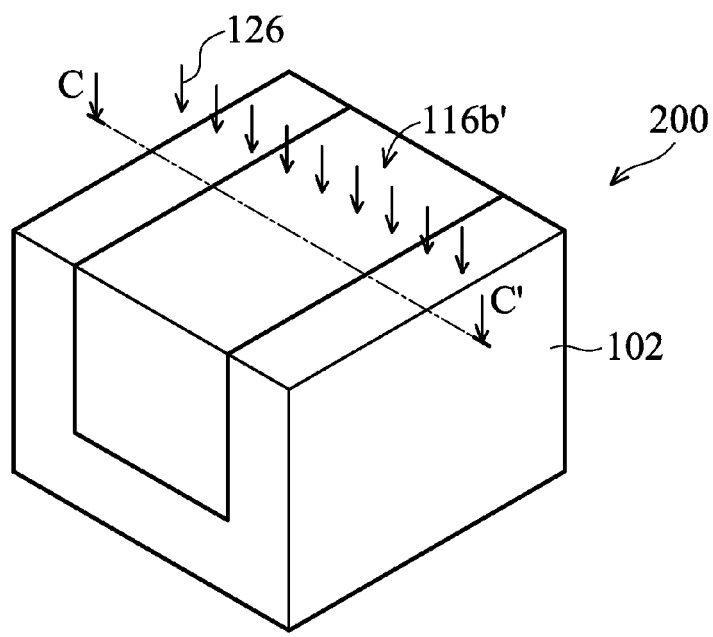
Figures 2, 2C:
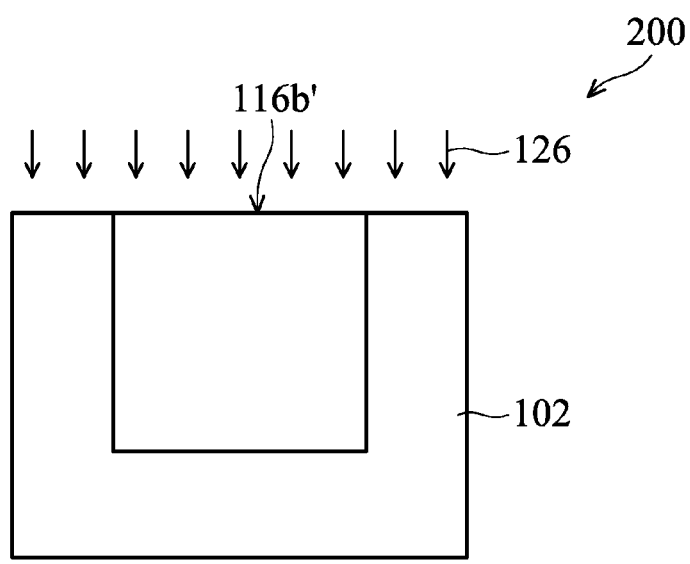

FIGS. 2A-1 to 2C-1 are perspective views of various stages of forming a semiconductor structure 200 in accordance with some embodiments. FIGS. 2A-2 to 2C-2 are cross-sectional representations of various stages of forming the semiconductor structure 200 shown along line C-C' as illustrated in FIGS. 2A-1 to 2C-1 in accordance with some embodiments. Some materials and processes shown in FIGS. 2A-1 to 2C-2 are similar to, or the same as, those described previously and may not repeated herein.

Similar to those shown in FIGS. 1A-1 to 1B-2, a hard mask structure may be formed over a substrate 102, and a first etching process may be performed through an opening of the hard mask structure to form a trench 110 in the substrate 102. After the trench 110 is formed in the substrate 102, a portion of the hard mask structure is removed to form a shrunken hard mask structure 104b', as shown in FIGS. 2A-1 and 2A-2 in accordance with some embodiments.

In some embodiments, the portion of the hard mask structure is removed to form an enlarged opening by performing a second etching process 112b. The amount of the hard mask structure removed in the second etching process 112b may be greater than that in the second etching process 112a shown in FIG. 1C-2. Accordingly, the size of a portion 114b of the substrate 102 exposed by the enlarged opening 106b' may be greater than that of the portion 114a shown in FIG. 1C-2. In some embodiments, the width $W_2$ of the portion 114b is greater than about 1 nm.

After the enlarged opening 106b' is formed, an epitaxial growth structure 116b is formed in the trench 110 and the enlarged opening 106b', as shown in FIGS. 2B-1 and 2B-2 in accordance with some embodiments. Processes used to form the epitaxial growth structure 116b may be similar to, or the same as, those used to form the epitaxial-growth structure 116a described previously and are not repeated herein.

The epitaxial growth structure 116b includes a top portion 118b formed in the enlarged opening 106b' and a bottom portion 120b formed in the trench 110, as shown in FIG. 2B-2 in accordance with some embodiments. Since the width of the enlarged opening 106b' is greater than the width of the trench 110, the width of the top portion 118b is also greater than the width of the bottom portion 120b. As shown in FIG. 2B-2, the top portion 118b of the epitaxial-growth structure 116b has an extending portion 121b formed over the portion 114b of the substrate 102. In addition, the extending portion 121b of the top portion 118b of the epitaxial-growth structure 116b is in direct contact with the sidewall of the shrunken hard mask structure 104b'.

As described previously, dislocations may be formed along the interface between the shrunken hard mask structure 104b' and the epitaxial-growth structure 116b. In some embodiments, the formation of the dislocations may be completely or substantially blocked by the portion 114b of the substrate 102, so that the dislocations penetrating into the epitaxial-growth structure 116b are substantially confined in the top portion 118b. Accordingly, the bottom portion 120b of the epitaxial-growth structure 116b may be substantially free from dislocations in accordance with some embodiments.

In addition, as described above, the amount of dislocation formed in the epitaxial-growth structure 116b may be related with the width $W_2$ and the thickness $T_3$ of the extending portion 121b. In some embodiments, a ratio of the thickness $T_3$ of the extending portion 121b to the width $W_2$ of the extending portion 121b is in a range from about 0.01 to about 2.

After the epitaxial-growth structure 116b is formed, a polishing process 126 is performed on the shrunken hard mask structure 104b' and the top portion 118b of the Epitaxial-growth structure 116b, as shown in FIGS. 2C-1 and 2C-2 in accordance with some embodiments. During the polishing process 126, the shrunken hard mask structure 104b' and the top portion 118b of the epitaxial-growth structure 116b are removed. As shown in FIG. 2C-2, the epitaxial-growth structure 116b' is formed in the trench 110. In addition, the epitaxial-growth structure 116a' is substantially dislocation-free and the whole region of the epitaxial-growth structure 116b' can be used as an active region in accordance with some embodiments. Therefore, numbers of active elements may be formed in the epitaxial-growth structure 116b' and the performance of the resulting semiconductor structure may be improved. The processes shown in FIGS. 1F-1 to 1I-2 may also be performed onto the epitaxial-growth structure 116b' and are not repeated herein.

It should be noted that, although the shrunken hard mask structure 104a' and 104b' shown in FIGS. 1A-1 to 2C-2 are rectangular, they are merely examples and the scope of the disclosure is not intended to be limiting. For example, the shapes and the profiles of shrunken hard mask structures may vary.

FIGS. 3A to 3H are cross-sectional representations of semiconductor structures 300c to 300j in accordance with some embodiments. The semiconductor structures 300c to 300j having various hard mask structures may be applied to the manufacturing processes described previously, and the same, or similar, processes and materials may not be repeated herein.

The semiconductor structure 300c may be formed after the processes shown in FIG. 1A-2 to 1C-2 are performed.

That is, a trench 110 may be formed in the substrate 102 by etching the substrate 102 though an opening of a hard mask structure (e.g. the hard mask structure 104), and a portion of the hard mask structure may be removed to from an enlarged opening 106c' in the shrunken hard mask structure 104c'.

Figure 3A:
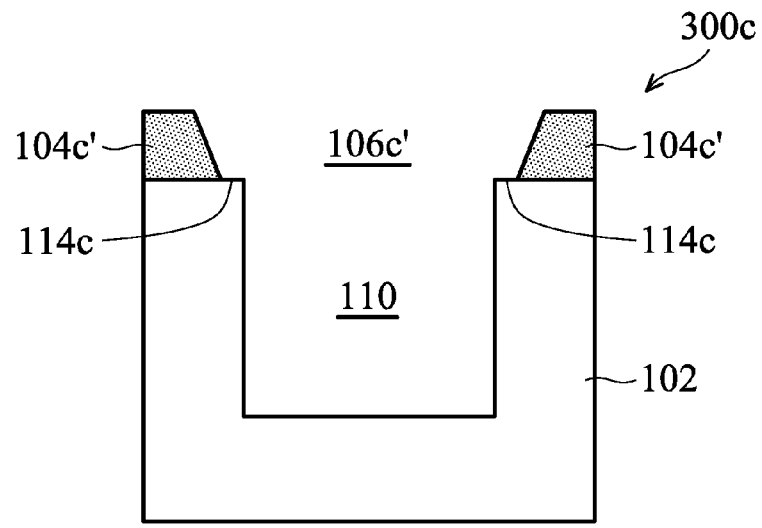
FIGS. 3A to 3I are cross-sectional representations of semiconductor structures in accordance with some embodiments.

The shrunken hard mask structure 104c' in the semiconductor structure 300c has a sidewall which is not perpendicular to the top surface of the substrate 102, as shown in FIG. 3A in accordance with some embodiments. In some embodiments, the shrunken hard mask structure 104c' has a sloped sidewall, and the angle between the sidewall and the bottom surface of the shrunken hard mask structure 104c' is smaller than 90°. After the shrunken hard mask structure 104c' is formed, the processes shown in FIGS. 1D-1 to 1I-2 may be performed.

Figure 3B:
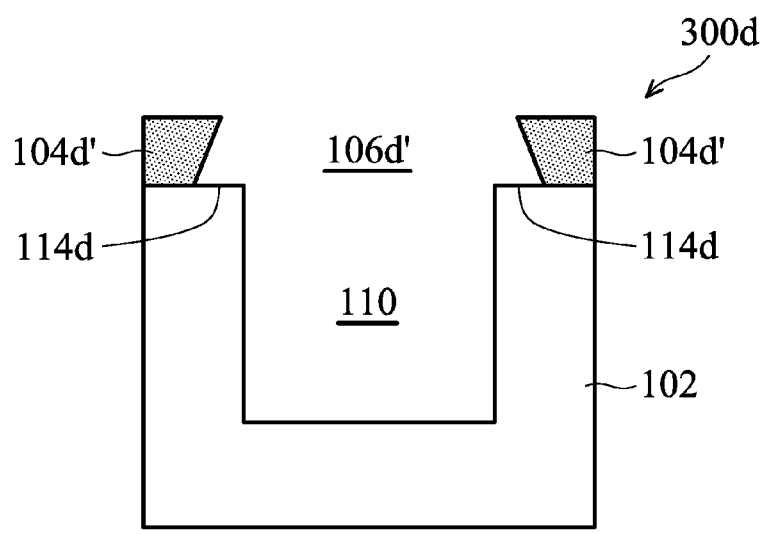

Similarly, the semiconductor structure 300d includes the shrunken hard mask structure 104d', and the shrunken hard mask structure 104d' has a sloped sidewall, as shown in FIG. 3B in accordance with some embodiments. In some embodiments, the angle between the sidewall and the bottom surface of the shrunken hard mask structure 104d' is greater than 90°.

Figure 3C:
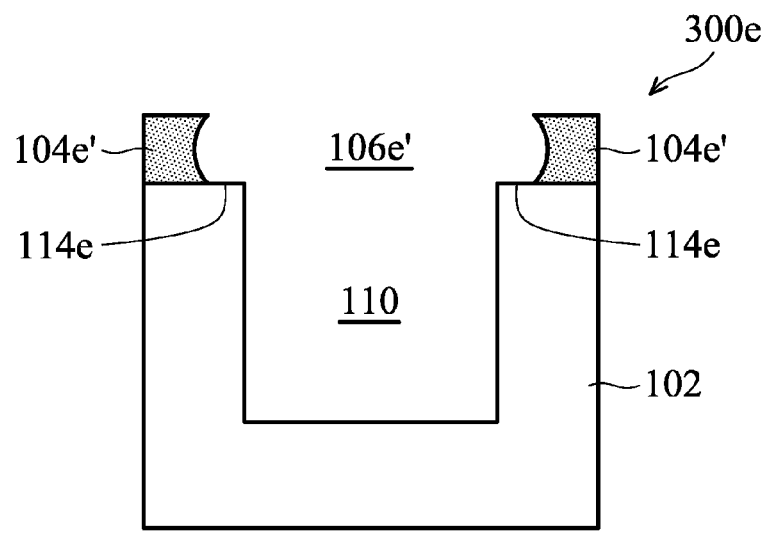

The semiconductor structure 300e includes the shrunken hard mask structure 104e', and the shrunken hard mask structure 104e' has a rounded sidewall, as shown in FIG. 3C in accordance with some embodiments. In some embodiments, the sidewall the shrunken hard mask structure 104e' is rounded inwardly, so that the middle portion of the shrunken hard mask structure 104e' is thinner than the top portion and the bottom portion of the shrunken hard mask structure 104e'.

Figure 3D:
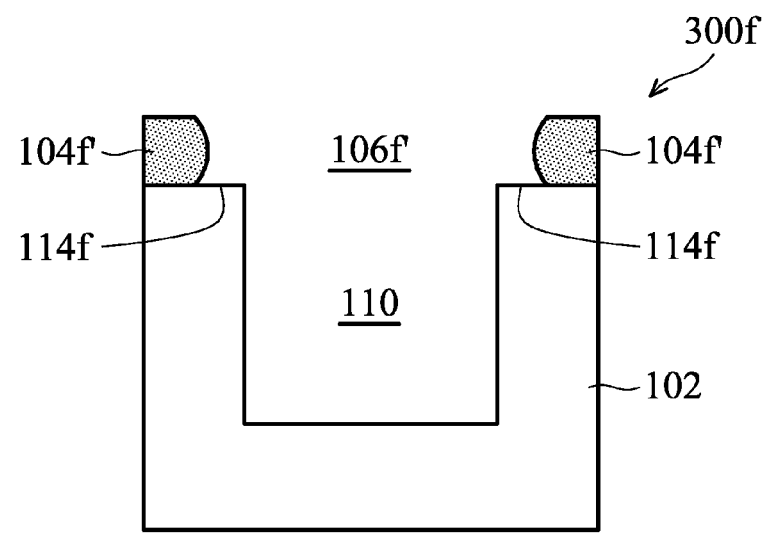

The semiconductor structure 300f includes the shrunken hard mask structure 104f', and the shrunken hard mask structure 104f' has a rounded sidewall, as shown in FIG. 3D in accordance with some embodiments. In some embodiments, the sidewall the shrunken hard mask structure 104f' is rounded outwardly, so that the middle portion of the shrunken hard mask structure 104f' is thicker than the top portion and the bottom portion of the shrunken hard mask structure 104f'.

Figure 3E:
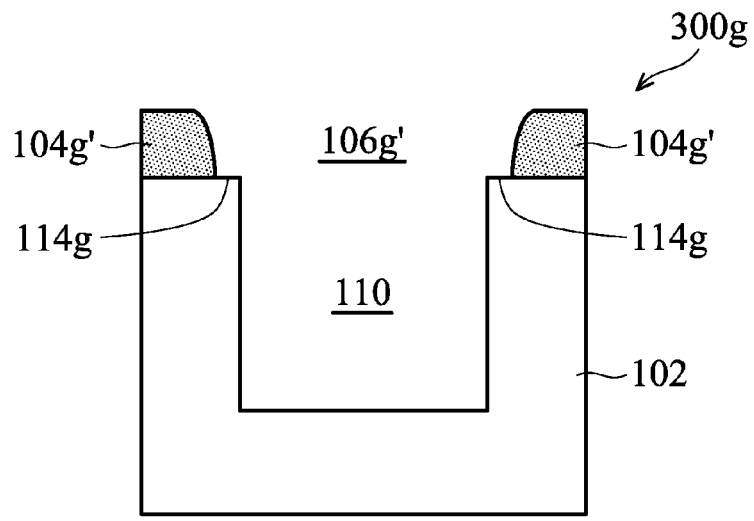

The semiconductor structure 300g includes the shrunken hard mask structure 104g', and the shrunken hard mask structure 104g' has a rounded sidewall, as shown in FIG. 3E in accordance with some embodiments. In some embodiments, the top portion of the shrunken hard mask structure 104g' is thinner than the bottom portion of the shrunken hard mask structure 104g'.

Figure 3F:
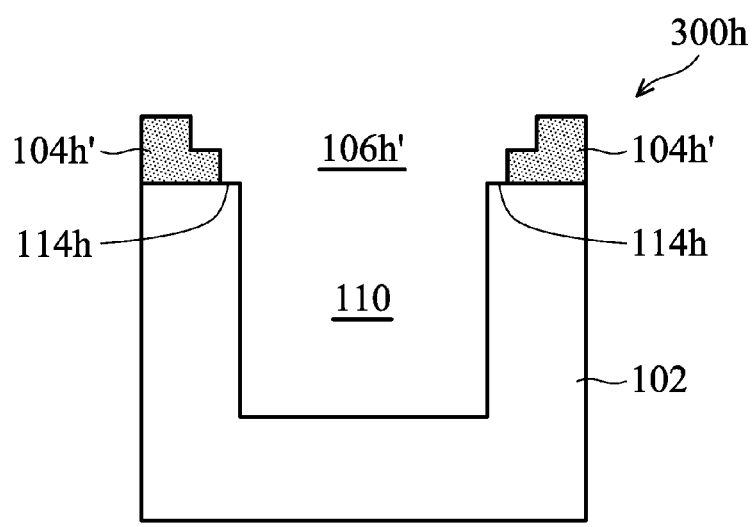

The semiconductor structure 300h includes the shrunken hard mask structure 104h', and the shrunken hard mask structure 104h' has a step-like sidewall, as shown in FIG. 3F in accordance with some embodiments. In some embodiments, the shrunken hard mask structure 104h' has a top portion and a bottom portion, and the top portion and the bottom portion are rectangular but have different widths. In some embodiments, the bottom portion of the shrunken hard mask structure 104h' is wider than the top portion of the shrunken hard mask structure 104h'.

Figure 3G:
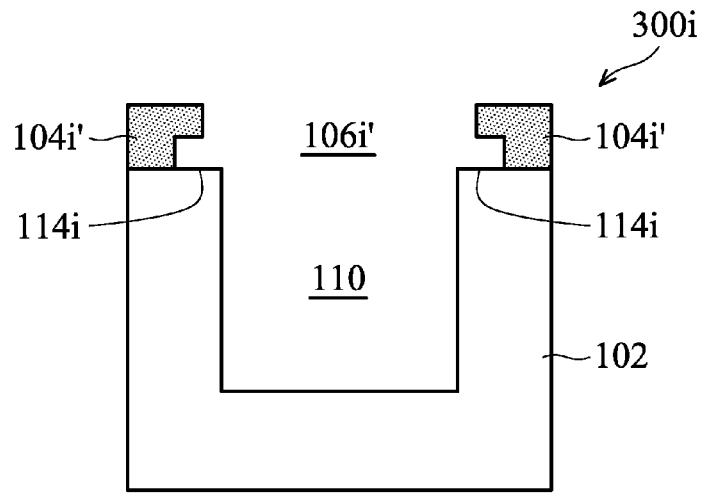

The semiconductor structure 300i includes the shrunken hard mask structure 104i', and the shrunken hard mask structure 104i' has a step-like sidewall, as shown in FIG. 3G in accordance with some embodiments. In some embodiments, the shrunken hard mask structure 104i' has a top portion and a bottom portion, and the top portion and the bottom portion are rectangular but have different widths. In some embodiments, the top portion of the shrunken hard mask structure 104i' is wider than the bottom portion of the shrunken hard mask structure 104h'.

Figure 3H:
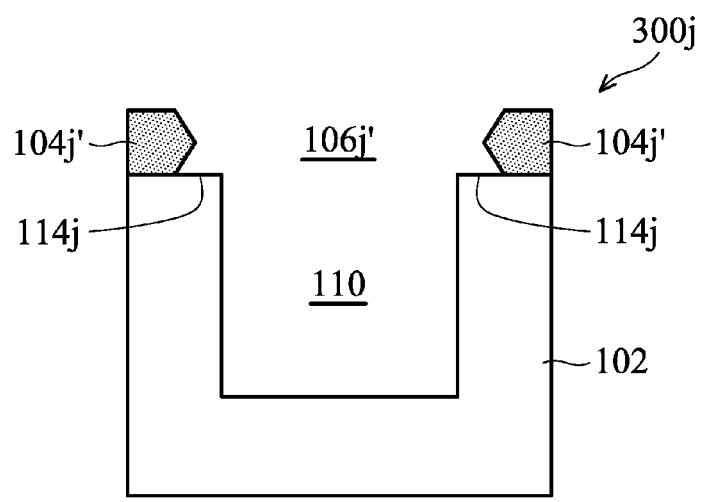

The semiconductor structure 300j includes the shrunken hard mask structure 104j', and the shrunken hard mask structure 104j' has an angled sidewall, as shown in FIG. 3H in accordance with some embodiments. In some embodiments, the sidewall the shrunken hard mask structure 104j' is angled outwardly, so that the middle portion of the shrunken hard mask structure 104j' is thicker than the top portion and the bottom portion of the shrunken hard mask structure 104j'.

Figure 3I:
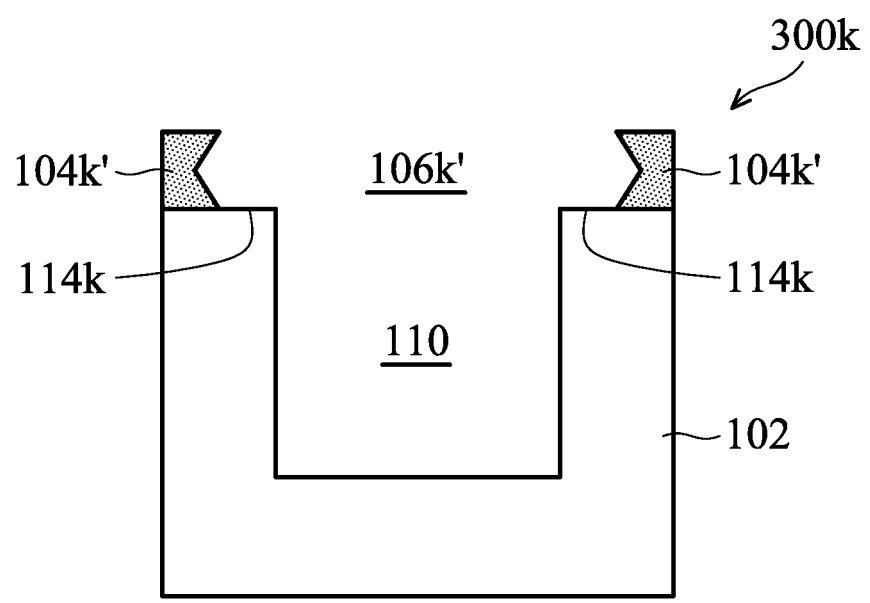

The semiconductor structure 300k includes the shrunken hard mask structure 104k', and the shrunken hard mask structure 104k' has an angled sidewall, as shown in FIG. 3I in accordance with some embodiments. In some embodiments, the sidewall the shrunken hard mask structure 104j' is angled inwardly, so that the middle portion of the shrunken hard mask structure 104k' is thinner than the top portion and the bottom portion of the shrunken hard mask structure 104k'.

It should be noted that the shapes and profiles of the shrunken hard mask structures 104a' to 104k' may be chosen according to the material which is used to form the epitaxial structure. For example, the shape of a shrunken hard mask structure may be chosen according to the dislocation angle of the material used to form the epitaxial structure.

Figure 4A:
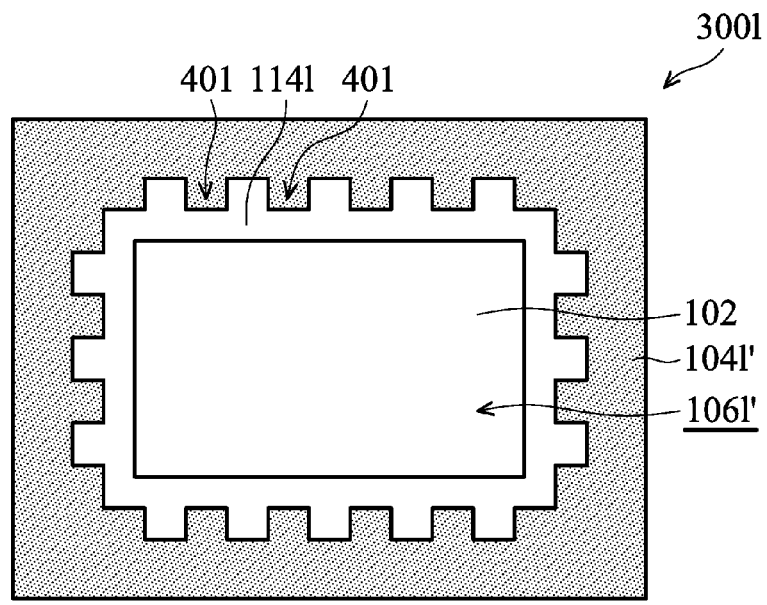
FIGS. 4A and 4B are top view representations of semiconductor structures in accordance with some embodiments.
Figure 4B:
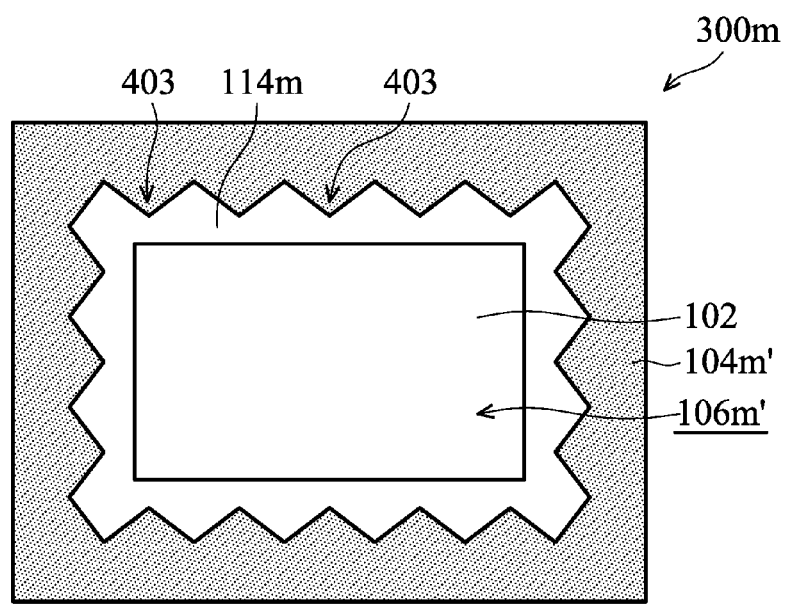

FIGS. 4A and 4B are top view representations of semiconductor structures 300l and 300m in accordance with some embodiments. Similar to the semiconductor structures 300c to 300k, the semiconductor structures 300l and 300m include shrunken hard mask structures 104l' and 104m' formed over substrates 102.

In the semiconductor structure 300l, the shrunken hard mask structure 104l' has an enlarged opening 106l', so that the portion 114l of the substrate 102 is exposed by the enlarged opening 106l'. As described previously, the portion 114l of the substrate 102 may block the formation of dislocations when an epitaxial structure (e.g. epitaxial structure 116a or 116b) is formed in subsequent processes.

In addition, the sidewall of the shrunken hard mask structure 104l' is not flat, so that the formation of dislocations may also be blocked by the sidewalls of the shrunken hard mask structure 104l', as shown in FIG. 4A in accordance with some embodiments. More specifically, the shrunken hard mask structure 104l' includes a number of extruded portions 401 in accordance with some embodiments. Therefore, when the epitaxial structure is grown, dislocations formed at one portion of the sidewall may be stopped by the other portion of the sidewall of the shrunken hard mask structure 104l', since the sidewall of the shrunken hard mask structure 104l' is not flat. In some embodiments, each of the extruded portions 401 of the shrunken hard mask structure 104l' has a rectangular shape, and the sidewalls of different portions of the shrunken hard mask structure 104l' are extended in at least two different directions.

Similarly, the shrunken hard mask structure 104m' in semiconductor structure 300m has an enlarged opening 106m', so that the portion 114m of substrate 102 is exposed by the enlarged opening 106m'. In addition, the sidewall of the shrunken hard mask structure 104m' is not flat, so that the formation of dislocations may also be blocked by the sidewalls of the shrunken hard mask structure 104l', as shown in FIG. 4B in accordance with some embodiments. In some embodiments, the shrunken hard mask structure 104l' includes a number of extruded portions 403, and the extruded portions 403 have a triangular shape in accordance with some embodiments. Therefore, when the epitaxial structure is grown, dislocation formed at one portion of the sidewall may stop by the other portion of the sidewall of the shrunken hard mask structure 104m'.

It should be noted that, although the extruded portions 401 of the shrunken hard mask structure 104l' shown in FIG. 4A are all rectangular and the extruded portions 403 of the shrunken hard mask structure 104m' shown in FIG. 4C are all triangular, the shapes and numbers of the extruded portions in a shrunken hard mask structure may vary according to application. For example, a shrunken hard mask structure may have extruded portions in various shapes and sizes.

In addition, although the semiconductor structures 300l and 300m are shown in their top view representations, their cross-sectional views may be similar to, or the same as, those shown in FIG. 1C-2, 2A-2, or 3A to 3I described previously. Therefore, the details of their applications and manufacturing processes may also be similar to, or the same as, those described previously and are not repeated herein.

As described previously, a hard mask structure is used to define a trench in a substrate, and an epitaxial structure is formed in the trench. However, when the epitaxial structure is formed, dislocations may be formed at the interface between the hard mask structure and the epitaxial structure, resulting in a relatively small active region.

Accordingly, in some embodiments of the disclosure, an additional etching process (e.g. the second etching processes 112a and 112b) is performed to form an enlarged opening (e.g. the enlarged openings 106a' to 106m') in a shrunken hard mask structure (e.g. shrunken hard mask structures 104a' to 104m'). After the shrunken hard mask structure is formed, an epitaxial structure (e.g. epitaxial structures 116a and 116b) having an extending portion (e.g. extending portions 121a and 121b) is formed. A great amount of dislocations may be confined in the extending portion (or in the top portion) of the epitaxial structure, and the extending portion may be removed afterwards. Therefore, dislocations in the resulting epitaxial structure may be reduced, and the active region in the epitaxial structure may be enlarged. Accordingly, the number of active elements formed in/on/ from the epitaxial structure may be increased, and the performance of the semiconductor structures may be improved.

Embodiments of methods for forming a semiconductor structures are provided. The method includes forming a hard mask structure having an opening over a substrate, and forming a trench in the substrate through the opening. After the trench is formed, a portion of the hard mask structure is removed to form a shrunken hard mask structure with an enlarged opening. An epitaxial structure is formed in the trench and in the enlarged opening. The epitaxial structure formed in the enlarged opening has an extending portion, and a great amount of the dislocations formed during the formation of the epitaxial structure may be confined in the extending portion. The extending portion of the epitaxial structure may be removed afterwards, and therefore an active region in the resulting epitaxial structure may have a relatively large size, and the performance of the active elements formed in/on/from the epitaxial structure may be improved.

In some embodiments, a method for manufacturing a semiconductor structure is provided. The method for manufacturing a semiconductor structure includes forming a hard mask structure over a substrate and etching the substrate through an opening of the hard mask structure to form a trench. The method for manufacturing a semiconductor structure further includes removing a portion of the hard mask structure to enlarge the opening and forming an epitaxial-growth structure in the trench and the opening.

In some embodiments, a method for manufacturing a semiconductor structure is provided. The method for manufacturing a semiconductor structure includes forming a hard mask structure having an opening over a substrate, and the substrate is made of a first semiconductor material. The method for manufacturing a semiconductor structure further includes etching the substrate through the opening of the hard mask structure to form a trench in the substrate and etching a portion of the hard mask structure to expose a portion of the top surface of the substrate. The method for manufacturing a semiconductor structure further includes growing a second semiconductor material in the trench to form an epitaxial-growth structure. In addition, the epitaxial-growth structure comprises an extending portion formed over the exposed portion of the top surface of the substrate.

In some embodiments, a method for manufacturing a semiconductor structure is provided. The method for manufacturing a semiconductor structure includes forming a hard mask structure having an opening over a substrate and forming a trench in the substrate by performing a first etching process through the opening of the hard mask structure. The method for manufacturing a semiconductor structure further includes removing a portion of the hard mask structure to enlarge the opening by performing a second etching process and forming a SiGe structure in the trench and the opening.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor structure, comprising:
    forming a hard mask structure over a substrate;
    etching the substrate through an opening of the hard mask structure to form a trench;
    removing a portion of the hard mask structure to enlarge the opening so that a sidewall of the hard mask structure has an extruded portion after the opening is enlarged;
    forming an epitaxial-growth structure in the trench and the opening;
    removing the hard mask structure completely;
    etching the epitaxial-growth structure to form a fin structure after the hard mask structure is removed; and
    forming a gate structure over the fin structure.

2. The method for manufacturing a semiconductor structure as claimed in claim 1, wherein the substrate is made of a first semiconductor material, and the epitaxial-growth structure is made of a second semiconductor material which is different from the first semiconductor material.

3. The method for manufacturing a semiconductor structure as claimed in claim 1, further comprising:
    removing a top portion of the epitaxial-growth structure to expose a top surface of the substrate.

4. The method for manufacturing a semiconductor structure as claimed in claim 3, wherein the epitaxial-growth structure comprises a dislocation region in the top portion of the epitaxial-growth structure.

5. The method for manufacturing a semiconductor structure as claimed in claim 1, wherein a portion of the top surface of the substrate is exposed by the opening after the opening is enlarged.

6. The method for manufacturing a semiconductor structure as claimed in claim 1, wherein a sidewall of the hard mask structure is not perpendicular to a top surface of the substrate.

7. The method for manufacturing a semiconductor structure as claimed in claim 1, wherein the epitaxial-growth structure comprises Si, Ge, SiGe, SiC, SiCGe, SiP, SiB, SiGeB, SiCP, GaAs, GaP, InP, InAs, InGaAs, AlInGaAs, GaAsP, AlInAs, AlGaAs, GaInP, or GaInAsP.

8. A method for manufacturing a semiconductor structure, comprising:
    forming a hard mask structure having an opening over a substrate, wherein the substrate is made of a first semiconductor material and the hard mask structure covers a first portion of a top surface of the substrate;
    etching the substrate through the opening of the hard mask structure to form a trench in the substrate;
    etching a portion of the hard mask structure to expose the first portion of the top surface of the substrate and to form an extruded portion of the hard mask structure over the substrate;
    fully filling the trench and the opening with a second semiconductor material to form an epitaxial-growth structure, wherein the epitaxial-growth structure comprises an extending portion formed over the first portion of the top surface of the substrate;
    removing the extending portion of the epitaxial-growth structure and the hard mask structure; and
    forming a fin structure from the epitaxial-growth structure after the hard mask structure is removed.

9. The method for manufacturing a semiconductor structure as claimed in claim 8, wherein the extending portion of the epitaxial-growth structure has a width greater than about 1 nm.

10. The method for manufacturing a semiconductor structure as claimed in claim 8, wherein the second semiconductor material comprises Si, Ge, SiGe, SiC, SiCGe, SiP, SiB, SiGeB, SiCP, GaAs, GaP, InP, InAs, InGaAs, AlInGaAs, GaAsP, AlInAs, AlGaAs, GaInP, or GaInAsP.

11. The method for manufacturing a semiconductor structure as claimed in claim 8, wherein the hard mask structure has a rounded sidewall.

12. The method for manufacturing a semiconductor structure as claimed in claim 8, further comprising:
    forming an isolation structure around the fin structure; and
    forming a gate structure across the fin structure and extending over the isolation structure.

13. A method for manufacturing a semiconductor structure, comprising:
    forming a hard mask structure having an opening over a substrate;
    forming a trench in the substrate by performing a first etching process through the opening of the hard mask structure;
    removing a portion of the hard mask structure to enlarge the opening and to form a number of extruded portions of the hard mask structure by performing a second etching process;
    forming a SiGe structure in the trench and the opening;
    removing the hard mask structure completely; and
    etching the SiGe structure to form a fin structure after the hard mask structure is removed.

14. The semiconductor structure as claimed in claim 13, wherein the hard mask structure has a sloped sidewall after the second etching process is performed.

15. The method for manufacturing a semiconductor structure as claimed in claim 13, wherein the hard mask structure has an angled sidewall after the second etching process is performed.

16. The method for manufacturing a semiconductor structure as claimed in claim 13, wherein the SiGe structure is in direct contact with a sidewall of the hard mask structure before the hard mask structure is removed.

17. The method for manufacturing a semiconductor structure as claimed in claim 13, further comprising:
    removing a top portion of the SiGe structure.

18. The method for manufacturing a semiconductor structure as claimed in claim 17, further comprising:
    forming a gate structure across the fin structure.

19. The method for manufacturing a semiconductor structure as claimed in claim 13, wherein the portion of the hard mask structure removed by the second etching process has a width greater than about 1 nm.

20. The method for manufacturing a semiconductor structure as claimed in claim 13, wherein a ratio of a first thickness of the portion of the hard mask structure removed by the second etching process to the width of the portion of the hard mask structure removed by the second etching process is in a range from about 0.01 to about 3.

* * * * *